United States Patent
Refai-Ahmed et al.

(10) Patent No.: US 7,911,791 B2
(45) Date of Patent: Mar. 22, 2011

(54) HEAT SINK FOR A CIRCUIT DEVICE

(75) Inventors: Gamal Refai-Ahmed, Markham (CA); Maxat Touzelbaev, San Jose, CA (US)

(73) Assignee: ATI Technologies ULC, Markham (CA)

( * ) Notice: Subject to any disclaimer, the term of this patent is extended or adjusted under 35 U.S.C. 154(b) by 24 days.

(21) Appl. No.: 12/490,805

(22) Filed: Jun. 24, 2009

(65) Prior Publication Data
US 2010/0328887 A1    Dec. 30, 2010

(51) Int. Cl.
H05K 7/20    (2006.01)
F28F 7/00    (2006.01)

(52) U.S. Cl. ......... 361/697; 165/121; 361/695; 361/703

(58) Field of Classification Search ............ 361/695, 361/697, 703
See application file for complete search history.

(56) References Cited

U.S. PATENT DOCUMENTS

| | | | |
|---|---|---|---|
| 5,019,880 A * | 5/1991 | Higgins, III. | 257/714 |
| 5,358,032 A * | 10/1994 | Arai et al. | 165/80.3 |
| 6,018,459 A * | 1/2000 | Carlson et al. | 361/704 |
| 6,084,770 A * | 7/2000 | Wyland | 361/692 |
| 6,747,865 B2 * | 6/2004 | Capriz et al. | 361/679.47 |
| 7,463,484 B2 * | 12/2008 | Wang et al. | 361/695 |
| 2005/0237718 A1 * | 10/2005 | Lee et al. | 361/697 |
| 2007/0151712 A1 * | 7/2007 | Foster et al. | 165/104.33 |

OTHER PUBLICATIONS

CPU coolers compared, p. 9—Pentium 4 coolers; www.dansdata.com/coolercomp_p9.htm; last modified Apr. 1, 2008; pp. 1-3.
Spire Powered by Innovation; http://www.spirecoolers.com/main/product_cpu.asp?p=15; May 7, 2009; pp. 1-2.

* cited by examiner

Primary Examiner — Gregory D Thompson
(74) Attorney, Agent, or Firm — Timothy M. Honeycutt

(57) ABSTRACT

Various heat sinks, method of use and manufacture thereof are disclosed. In one aspect, a method of providing thermal management for a circuit device is provided. The method includes placing a heat sink in thermal contact with the circuit device wherein the heat sink includes a base member in thermal contact with the circuit device, a first shell coupled to the base member that includes a first inclined internal surface, a lower end and first plurality of orifices at the lower end to enable a fluid to transit the first shell, and at least one additional shell coupled to the base member and nested within the first shell. The at least one additional shell includes a second inclined internal surface and a second plurality of orifices to enable the fluid to transit the at least one additional shell. The fluid is moved through the first shell and the at least one additional shell.

27 Claims, 4 Drawing Sheets

HEAT SINK FOR A CIRCUIT DEVICE

BACKGROUND OF THE INVENTION

1. Field of the Invention

This invention relates generally to electronic devices, and more particularly to heat sinks for providing thermal management of electronic devices, including semiconductor chips.

2. Description of the Related Art

Heat buildup within computing devices, such as computers and game consoles, is potentially troublesome not only for the high-power dissipation devices, such as the various processors and memory devices within such devices, but also for all of the other components housed within the device enclosure, including data storage devices, chipsets and even the various passive components on a typical system board. To transfer heat from various internal components, many conventional computing devices incorporate a heat sink in thermal contact with the higher heat dissipating devices along with a cooling fan.

Conventional heat sinks and cooling fans come in a large variety of configurations. Most include multiple thin plates joined or otherwise fastened to a base and spaced closely together. The base is designed to seat on a thermal spreader or lid associated with a given semiconductor device and provide a thermal resistance pathway. In some conventional designs, air is directed past the plates in a direction parallel to the long axes thereof and either allowed to directly exit the plates or first impinge the base and then exit laterally. These parallel flow conventional designs use so-called direct flow. In another variant, air is pulled upward as opposed to being directed downward.

Many current vendors offer different models of heat sinks. Some examples include the Model TR2-R1 CPU Cooler from Thermaltake, the Model CNPS 7500 from Zalman, and the Model SP420B8 CopperStream from Spire.

SUMMARY OF THE INVENTION

In accordance with one aspect of the present invention, a method of providing thermal management for a circuit device is provided. The method includes placing a heat sink in thermal contact with the circuit device wherein the heat sink includes a base member in thermal contact with the circuit device, a first shell coupled to the base member that includes a first inclined internal surface, a lower end and first plurality of orifices at the lower end to enable a fluid to transit the first shell, and at least one additional shell coupled to the base member and nested within the first shell. The at least one additional shell includes a second inclined internal surface and a second plurality of orifices to enable the fluid to transit the at least one additional shell. The fluid is moved through the first shell and the at least one additional shell.

In accordance with another aspect of the present invention, a method of manufacturing is provided that includes coupling a first shell to a base member that is adapted to establish thermal contact with a circuit device. The first shell includes a first inclined internal surface, a lower end and first plurality of orifices at the lower end to enable a fluid to transit the first shell. At least one additional shell is coupled to the base member in a nested arrangement within the first shell. The at least one additional shell includes a second inclined internal surface and a second plurality of orifices to enable the fluid to transit the at least one additional shell.

In accordance with another aspect of the present invention, a heat sink is provided that includes a base member adapted to establish thermal contact with a circuit device and a first shell coupled to the base member that includes a first inclined internal surface, a lower end and first plurality of orifices at the lower end to enable a fluid to transit the first shell. At least one additional shell is coupled to the base member and nested within the first shell. The at least one additional shell includes a second inclined internal surface and a second plurality of orifices to enable the fluid to transit the at least one additional shell.

In accordance with another aspect of the present invention, an apparatus is provided that includes a circuit device and a heat sink. The heat sink includes a base member in thermal contact with the circuit device, a first shell coupled to the base member that includes a first inclined internal surface, a lower end and first plurality of orifices at the lower end to enable a fluid to transit the first shell. At least one additional shell is coupled to the base member and nested within the first shell. The at least one additional shell includes a second inclined internal surface and a second plurality of orifices to enable the fluid to transit the at least one additional shell.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a heat sink are described herein. One exemplary configuration includes plural nested conical shells coupled to a central hub. The hub is attached to a base suitable to seat on a circuit device to provide a thermal pathway. The conical shells include respective sets orifices to enable direct flow and cross-flow mixing of air. Additional details will now be described.

Figure 1:
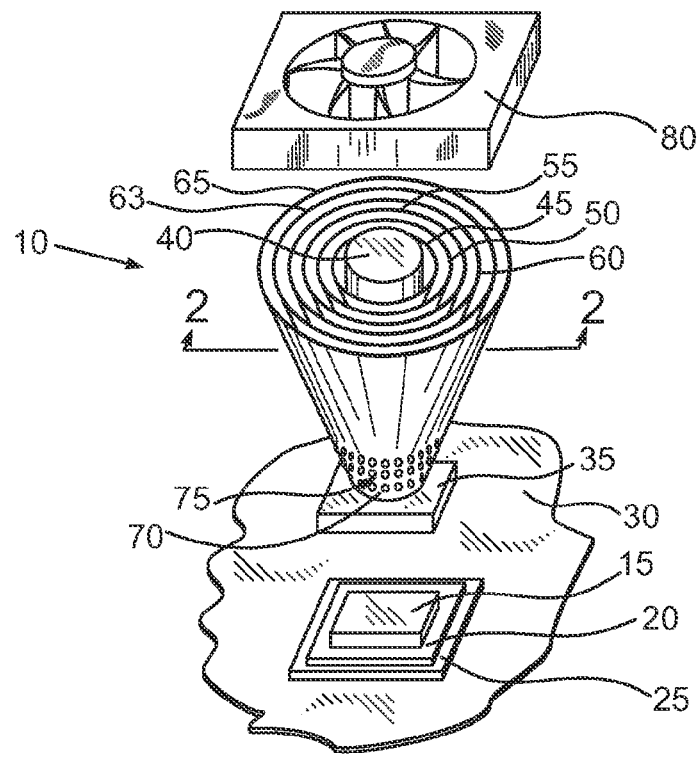
FIG. 1 is a partially exploded pictorial view of an exemplary embodiment of a heat sink that may be used to provide thermal management of various circuit devices.

In the drawings described below, reference numerals are generally repeated where identical elements appear in more than one figure. Turning now to the drawings, and in particular to FIG. 1, therein is shown a partially exploded pictorial view of an exemplary embodiment of a heat sink 10 that may be used to provide thermal management of various circuit devices. In this illustrative embodiment, the heat sink 10 may be used to provide thermal management of a circuit device 15, which may be virtually any type of electronic device that can benefit from thermal management. Examples include microprocessors, graphics processors, combined microprocessor/graphics processors, application specific integrated circuits, memory devices or the like, and such devices may be single core, multi-core and/or stacked in groups of multiple devices.

Other examples include optical devices, such as lasers. In this illustrative embodiment, the circuit device 15 may consist of a semiconductor chip mounted on a carrier substrate 20. The carrier substrate 20 is shown mounted on an optional socket 25 that is in-turn, mounted on a printed circuit board 30. The PCB 30 may be a motherboard, a circuit card, or virtually any other type of printed wiring board. Note that only a small portion of the PCB 30 is shown. It should be understood that the PCB 30 may be part of a larger system, such as a computer, a game console or other type of computing device.

The heat sink 10 includes a base member 35 that is designed to seat on the circuit device 15. The base member 35 advantageously provides a surface area that at least approximates the surface area of the circuit device 15 so that a low thermal resistance pathway from the circuit device 15 is established. The base member 35 is advantageously constructed from a material(s) exhibiting desirable thermal conductivity. Examples include copper, nickel, aluminum, steel, combinations of these or the like. Somewhat more exotic materials, such as diamond or sapphire, could also be used for extreme thermal environments. A thermal grease (not shown) may be applied to the interface between the base member 35 and the circuit device 15 in order to further enhance conductive heat transfer between the two components. The heat sink 10 may include a central hub or column 40 to which a plurality of concentric conical shells 45, 50, 55, 60, 63 and 65 are attached. The lower end 70 of the outermost conical shell 65 is provided with a plurality of orifices 75. The other conical shells 45, 50, 55, 60 and 63 may be provided with corresponding pluralities of orifices that are not visible in FIG. 1 but will be depicted in subsequent figures. The hub 40 and the shells 45, 50, 55, 60 and 65 all serve to transfer heat both by conduction and convection. Accordingly, the same types of materials used to fabricate the base member 35 may be used for hub 40 and the shells 45, 50, 55, 60, 63 and 65.

An air mover 80 may be positioned above the heat sink 10 to direct air down or up through the conical shells 45, 50, 55, 60, 63 and 65. The air mover 80 may take on a myriad of different configurations, such as a fan, a vibrating membrane or the like.

Figure 2:
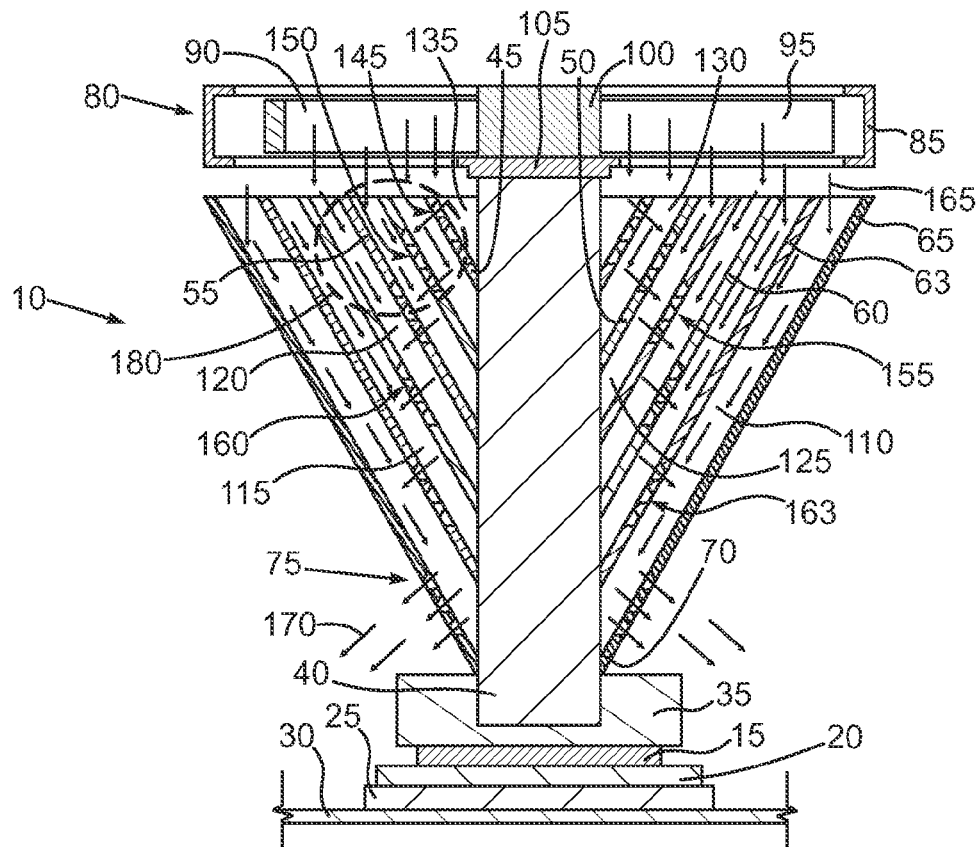
FIG. 2 is a sectional view of FIG. 1 taken at section 2-2.

Additional details of the heat sink 10 may be understood by referring now also to FIG. 2, which is a sectional view of FIG. 1 taken at section 2-2. Note that the base 35 of the heat sink 10 is shown seated on the stack consisting of the circuit device 15, the carrier substrate 20, the socket 25 and the PCB 30. A clamping mechanism (not shown) may be used to secure the heat sink 10 in position on the PCB 30. Here the air mover 80 is depicted seated on the hub 40 of the heat sink 10. However, it should be appreciated that the air mover 80 may be supported in any of a large variety of configurations. The air mover 80 includes a housing 85 that partially encloses a plurality of blades, two of which are visible and labeled 90 and 95, respectively. The blades 90 and 95 are connected to a central hub 100 that may include a motor (not visible). A base 105 may project downwardly from the housing 85 to seat on the hub 40 of the heat sink 10.

The outermost conical shell 65 has a larger inlet (for the flow direction depicted) diameter and longer length than the other concentrically placed conical shells 45, 50, 55, 60 and 63. The other conical shells 45, 50, 55, 60 and 63 have successively smaller inlet diameters and heights. The gap between the outermost conical shell 65 and the next inwardly positioned conical shell 63 defines an interior conical shell-shaped flow space 110. The respective gaps between the conical shells 63 and 60, 60 and 55, 55 and 50, and 50 and 45 define respective, albeit successively smaller, flow spaces 115, 120, 125 and 130. The interior space of the conical shell 45 defines another flow space 135. The conical shells 45, 50, 55, 60, 63 and 65 may be secured to the hub 40 by soldering, various types of fasteners, and/or adhesives. The hub 40 may be secured to the base 35 by soldering, various types of fasteners or by way of an interference fit as depicted in FIG. 2.

As noted above, the lower end 70 of the conical shell 65 includes plural orifices 75. The conical shells 45, 50, 55, 60 and 63 include respective pluralities 145, 150, 155, 160 and 163 of orifices that are positioned at successively higher elevations relative to the plurality of orifices 75 due to the successively smaller heights of the conical shells 63, 60, 55, 50 and 45. The orifices 75, 145, 150, 155, 160 and 163 may be circular, oval, or some other shape such as a slit.

The air mover 80 directs air into the flow spaces 110, 115, 120, 125, 130 and 135. Because the shells 45, 50, 55, 60 and 65 are conical, the incoming air 165 will strike the inner walls of the shells 45, 50, 55, 60, 63 and 65 and proceed downward. Inlet air 165 flowing in the flow space 135 and proceeding down the interior wall of the conical shell 45 will almost immediately encounter the plural orifices 145 and proceed laterally into the next flow space 130. At this point, inlet air 165 that has previously entered the space 130 will, by way of both direct and cross-flow, engage in vigorous mixing due to the interactions of air flowing downward in the space 130 and the introduction of a cross-flow from the orifices 145 of the shell 45. This process of cross-flow and direct flow mixing occurs in all of the flow spaces 110, 115, 120, 125, 130 and 135. Ultimately, discharge air 170 will leave the plural orifices 70 in the outermost conical shell 65. The outlet air 170 is then, depending upon the configuration of the printed circuit board 30, free to provide convective heat transfer for other components that may be either on the printed circuit board 30 or within the general vicinity of the heat sink 10.

Figure 3:
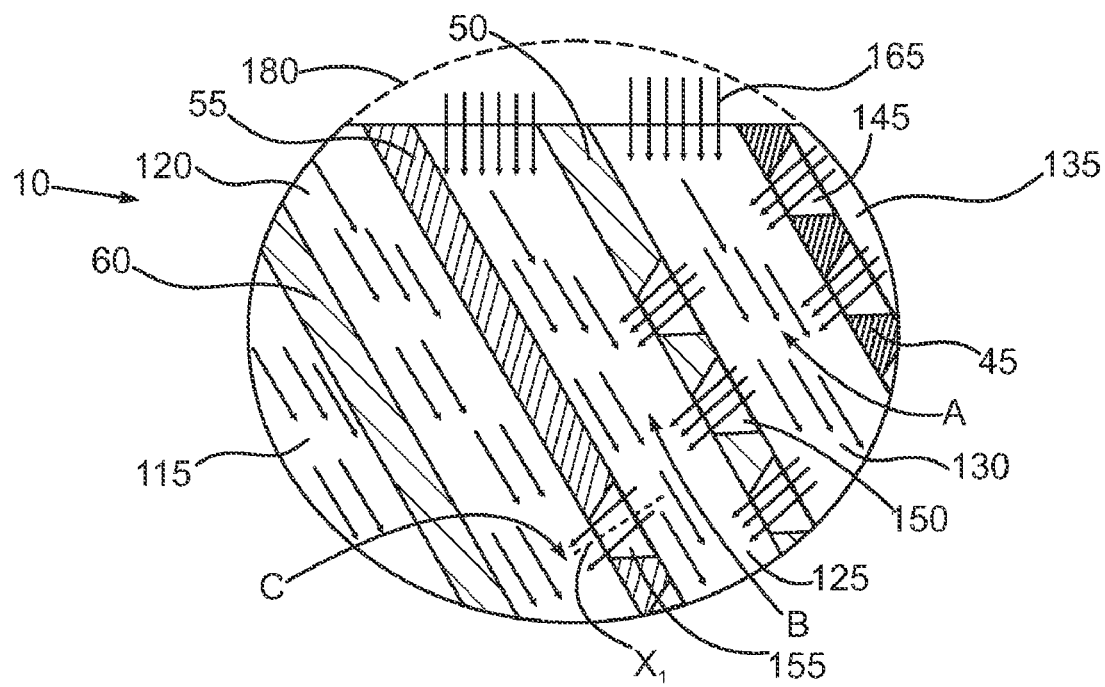
FIG. 3 is a portion of FIG. 2 shown at greater magnification.

The portion of FIG. 2 circumscribed by the dashed oval 180 will be shown at greater magnification in FIG. 3 in order to illustrate further details of the heat sink 10. Attention is now turned to FIG. 3. Note that because of the location of the dashed oval 180 in FIG. 2, portions of the conical shells 45, 50, 55 and 60 are visible as well as the flow spaces 115, 120, 125, 130 and 135. As the incoming air 165 enters the flow spaces 125, 130 and 135, portions quickly pass through the plural orifices 145 and mix at region A with direct flow air in the flow space 130. As the now mixing air proceeds further downward, some of it is bypassed through the plural orifices 150 in the conical shell 50 and enters the flow space 125 to produce a significant mixing at region B. As the combination of direct and cross-flow air proceeds further downward through the flow space 125, some of that air is bypassed through the orifices 155 in the conical shell 55 and enters the flow space 120 to produce a cross-flow to direct flow mixing at region C. This successive mixing from one flow space to another by way of cross-flow and direct flow interactions maintains a substantially turbulent flow pattern that enhances the convective heat transfer from the surfaces of the conical shells 45, 50, 55 and 60 above and beyond that which would be provided by a direct flow type of heat sink.

It should be understood that the number of conical shells 45, 50, 55, 60, 63 and 65, the spacing therebetween and the thicknesses thereof may be subject to great variety. Thicker shell walls increase the weight of the heat sink 10. Thinner shell walls will have less mechanical strength and perhaps greater thermal resistance, so there will be a trade off between shell wall mechanical strength and thermal resistance. The spacing between the conical shells 45, 50, 55, 60, 63 and 65 may be uniform or variable as desired.

The conical shells 45, 50, 55, 60, 63 and 65 may be formed by stamping, forging, casting or other material forming techniques. The orifices 145, 150, 155 (as well as the other orifices depicted in FIGS. 1 and 2) may be formed by punching, laser drilling, mechanical drilling, or other material removal techniques. In the embodiment illustrated in FIGS. 1-3, the orifices 70, 145, 150, 155, 160 and 163 have a generally conical cross-section. However, cylindrical or other shapes may be used. Various orientations may be used for the orifices 70, 145, 150, 155, 160 and 163. The following discussion will focus on one of the orifices 155, but may be illustrative of the other orifices 145, 150, 160 and 163. Note that the orifice 155 has a principal axis $X_1$ that is approximately normal to the wall of the shell 55. This represents one possible orientation of the orifice 155. Another possibility will now be described.

Figure 4:
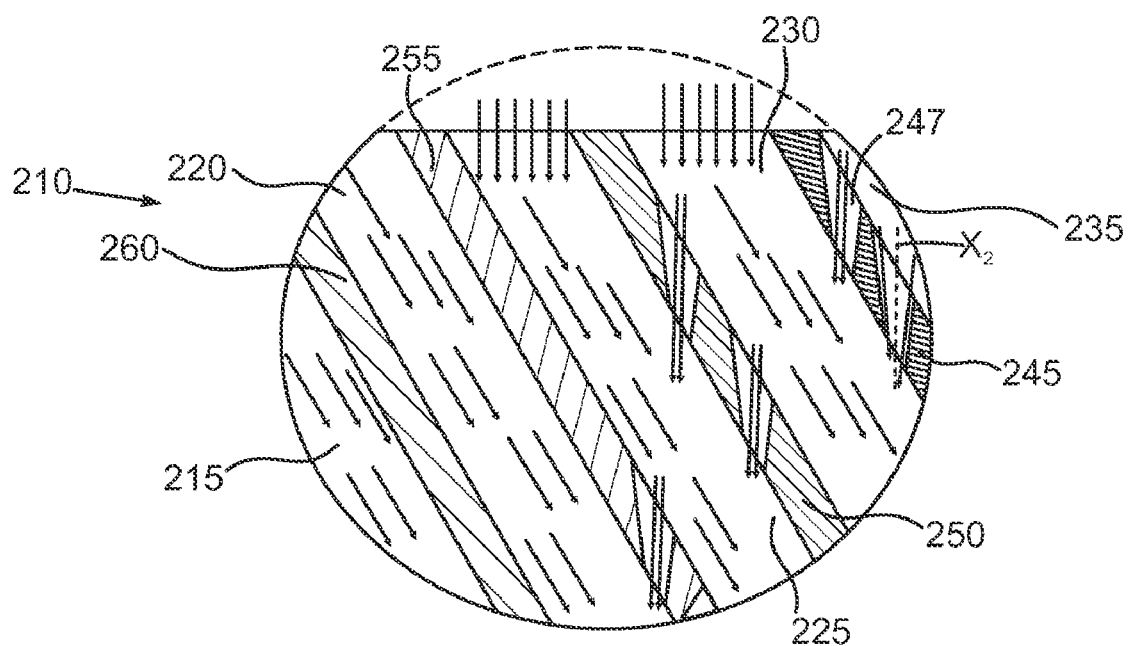
FIG. 4 is a sectional view like FIG. 3 but of an alternate exemplary embodiment of a heat sink.

In the exemplary embodiment depicted in FIGS. 1, 2 and 3, the orifices 70, 145, 150, 155, 160 and 163 in the conical shells 45, 50, 55, 60, 63 and 65 have a general principle axis $X_1$ that is relatively normal to the surfaces of their respective conical shells 45, 50, 55, 60, 63 and 65. However, the orifices in the conical shells may be oriented at other than an orthogonal orientation relative to their respective shells. In this regard, FIG. 4 depicts an alternate exemplary embodiment of a heat sink 210. FIG. 4 is a magnified view of a small portion of the heat sink 210 not unlike the magnified view depicted in FIG. 3. In this illustrative embodiment, a few of the flow spaces 215, 220, 225, 230 and 235 defined by the respective conical shells 245, 250, 255 and 260 are depicted. In this illustrative embodiment and using the conical shell 245 as an example, flow orifices 247 may be provided at other than an orthogonal configuration relative to the conical shell 245. In this regard, the orifice 245 may have a principal axis $X_2$ that is rotated at an angle relative to the conical shell 45 as shown to provide flow pathways that involve smaller turning angles. This configuration may provide a slightly smoother transition for the air to traverse from one flow space to the next and vice versa.

Figure 5:
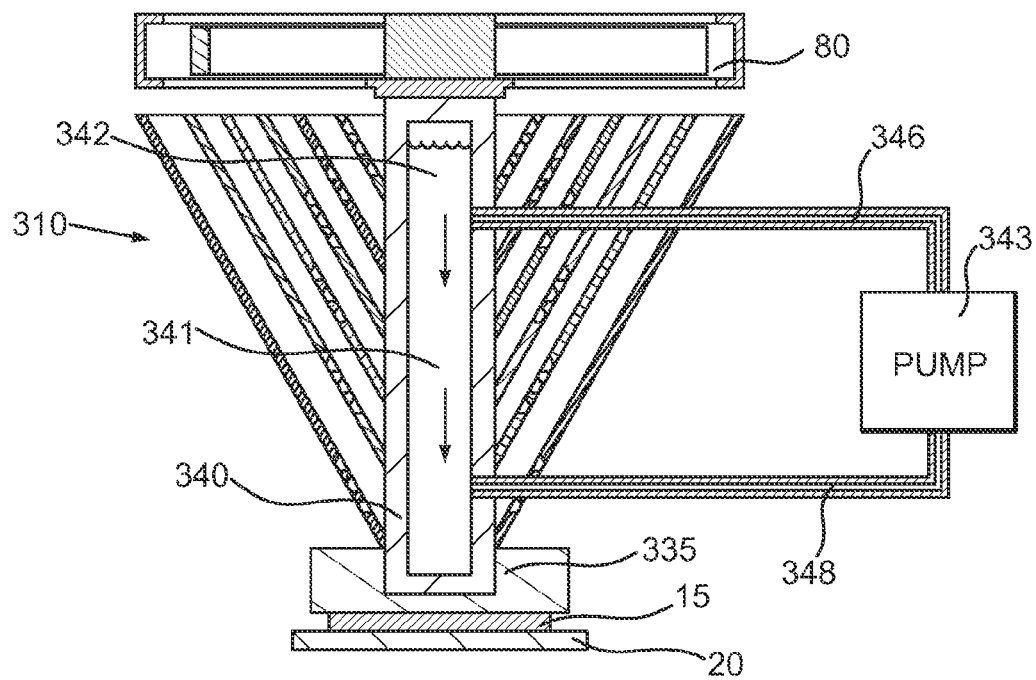
FIG. 5 is a sectional view like FIG. 2 but of another alternate exemplary embodiment of a heat sink.

In the foregoing illustrative embodiments, the hub 40 is configured as a solid member. However, it should be understood that a hub may be configured to serve as a vessel for a coolant or coolants. In this regard, attention is now turned to FIG. 5, which is a sectional view like FIG. 2 but of an alternate exemplary embodiment of a heat sink 310. The heat sink 310 may be configured substantially like the heat sink 10 depicted in FIGS. 1, 2 and 3. In this regard, the air mover 80 may be seated on the heat sink 310 and the heat sink 310, including a base 335, used to cool the circuit device 15 that is mounted on the carrier substrate 20. However, in this illustrative embodiment the hub 340 is provided with an internal chamber 341 that may be used to hold a coolant 342 either in liquid phase or as a two phase system such as is often used in a vapor chamber. The coolant 342 may be water, alcohol, glycol or other types of fluids. An optional pump 343 may be connected to the chamber 341 by way of an inlet tube 346 and an outlet tube 348. In this way, coolant may be actively circulated in and out of the chamber 341 to provide an active cooling system. The pump 343 could be supplanted or replaced with another type of heat sink and the inlet and outlet tubes 346 and 348 could be configured as heat pipes if desired.

Figure 6:
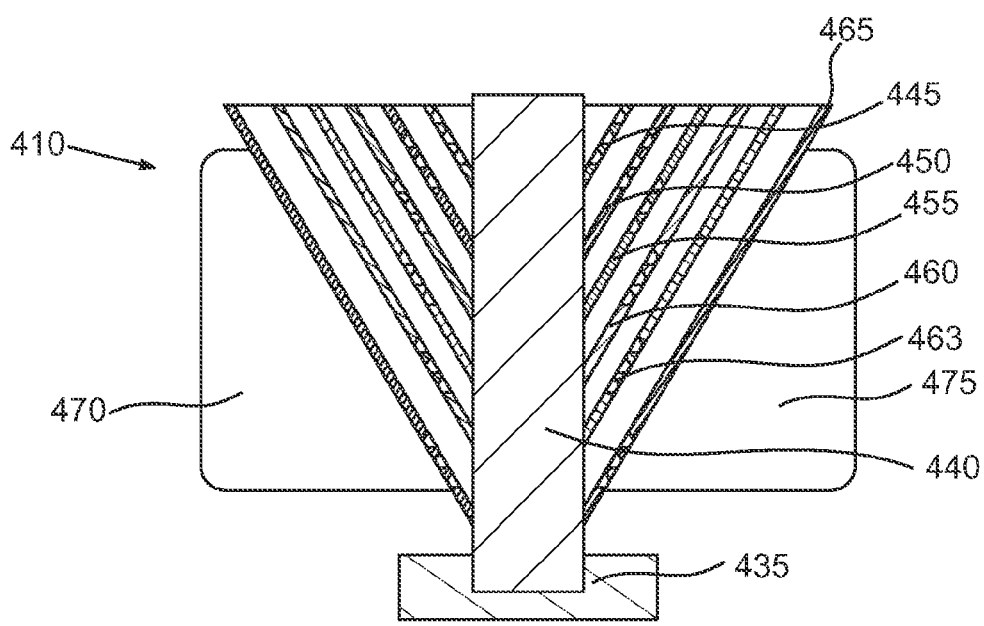
FIG. 6 is a sectional view like FIG. 5 of another alternate exemplary embodiment of a heat sink.

A heat sink utilizing plural conical shells may be combined with more conventional heat fin arrangements to provide an even greater surface area for convective and radiative heat transfer. An exemplary embodiment incorporating such a hybrid design is depicted in FIG. 6, which is a sectional view like FIG. 5. In this illustrative embodiment, a heat sink 410 may be configured very much like the embodiments depicted in FIGS. 1, 2 and 3 with a few notable exceptions. The heat sink 410 may include a base member 435 and a hub 440 seated thereon. Plural conical shells 445, 450, 455, 460, 463 and 465 are connected to the hub 440. In addition, one or more heat fins, two of which are visible and labeled 470 and 475, maybe connected to or integrally formed with the conical shell 465. If desired, the number of additional fins, such as the fins 470 and 475, may be quite large and actually extend around the periphery of the conical shell 465 to further enhance the surface area available for convective and radiative heat transfer. The fins 470 and 475 may be fabricated from the same types of materials that the heat sink 410 itself is fabricated from and be secured to the conical shell 465 by way of solder, or integral stamping, forging, casting, plating or other manufacturing techniques. An optional air mover of the type described elsewhere herein is not shown for simplicity of illustration.

Figure 7:
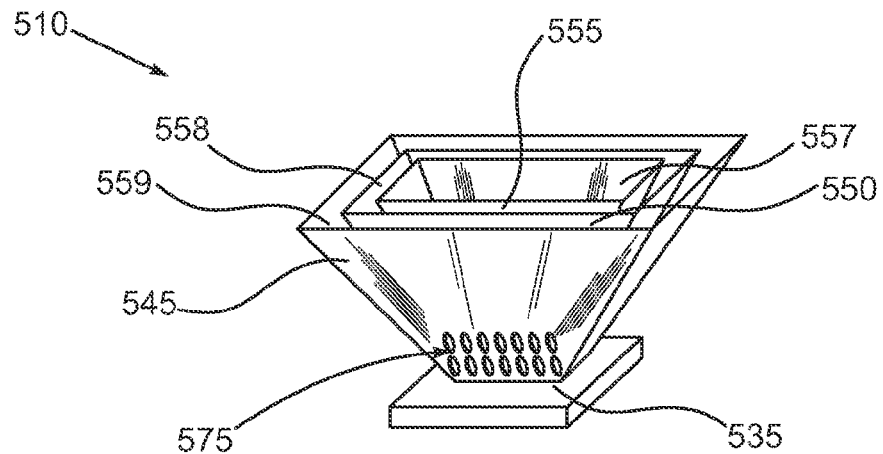
FIG. 7 is a pictorial view of another exemplary embodiment of a heat sink.

In the embodiments disclosed herein, a fluid such as air, is moved through nested shells. The shells advantageously include inclined internal surfaces or walls. The embodiments illustrated in FIGS. 1-6 use inclined generally conical shells. However, other than a geometrical cone shape may be used to provide an inclined internal surface. FIG. 7 is a pictorial view of an alternate exemplary embodiment of a heat sink 510 that includes a base member 535 on which plural nested shells 545, 550, and 555 are seated. Here the shells 545, 550 and 555 may have a generally rectangular footprint with respective inclined internal surfaces 557, 558 and 559. The shells 545, 550 and 555 may have respective pluralities of orifices, typified by the orifices 575 in the shell 545 that function like the other orifices described herein.

Figure 8:
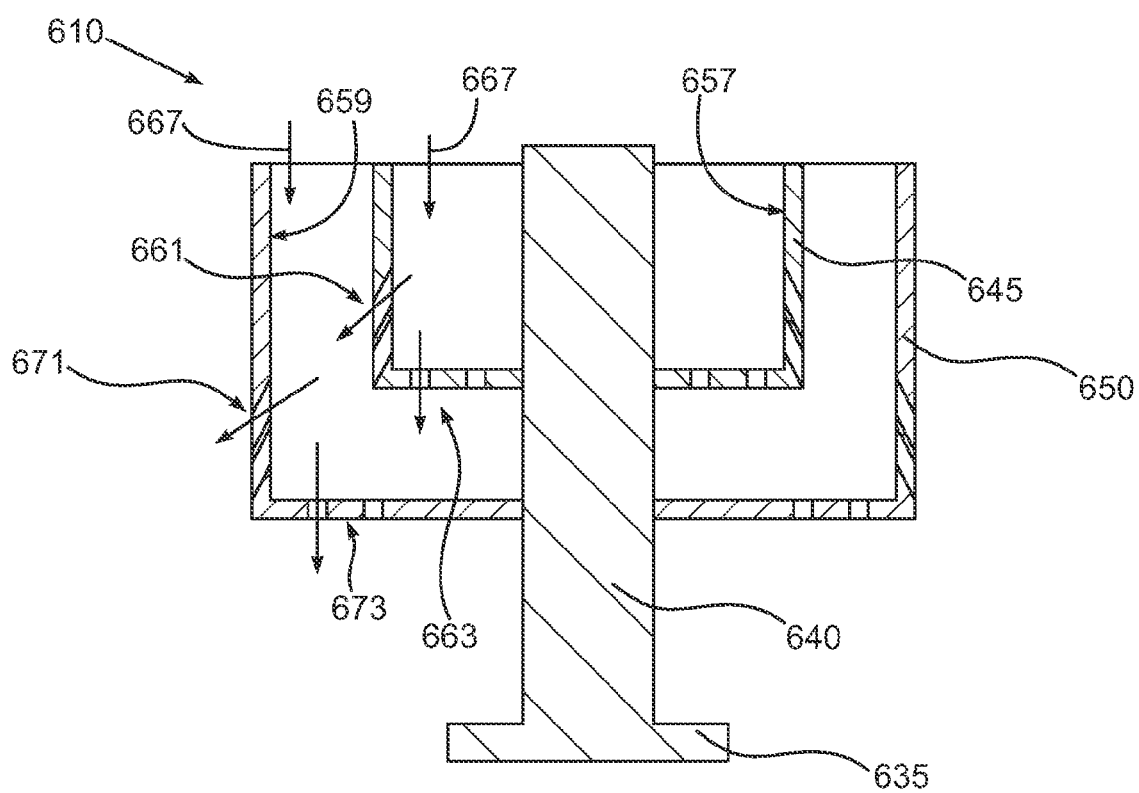
FIG. 8 is a sectional view of another exemplary embodiment of a heat sink.

Another alternate exemplary embodiment of a heat sink 610 may be understood by referring now to FIG. 8, which is a sectional view. In this embodiment, the heat sink 610 includes a base member 635 and a hub 640 coupled or otherwise joined thereto. Plural nested shells, two of which are illustrated and labeled 645 and 650, are coupled to the hub 640. Here the shells 645, and 650 may have a generally round, rectangular or other footprint with respective inclined, in this case vertical, internal surfaces 657 and 659. It should be understood that inclined herein contemplates vertical. The shell 645 may include plural orifices at 661 and 663 to enable fluid 667, such as air, to transit into the shell 650. The shell 650 may include plural orifices at 671 and 673 to enable air to exit. The number and arrangement of the orifices at 661, 663, 671 and 673 may be varied as well as the number of shells 645 and 650. The materials and fabrication techniques disclosed elsewhere herein may be applied to the heat sink 610.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of providing thermal management for a circuit device, comprising:

placing a heat sink in thermal contact with the circuit device, the heat sink including a base member in thermal contact with the circuit device, a first shell coupled to the base member and including a first non-vertically inclined internal surface, a lower end and first plurality of orifices at the lower end to enable a fluid to transit the first shell, and at least one additional shell coupled to the base member and nested within the first shell, the at least one additional shell including a second non-vertically inclined internal surface and a second plurality of orifices to enable the fluid to transit the at least one additional shell; and moving the fluid through the first shell and the at least one additional shell.

2. The method of claim 1, comprising moving the fluid with an air mover.

3. The method of claim 1, wherein the first shell and the at least one additional shell comprise conical shells.

4. The method of claim 1, wherein the second plurality of orifices is positioned at different axial position than the first plurality of orifices.

5. The method of claim 1, wherein the at least one additional shell is shorter than the first shell.

6. The method of claim 1, wherein the circuit device comprises a semiconductor chip.

7. A method of manufacturing, comprising:
coupling a first shell to a base member adapted to establish thermal contact with a circuit device, the first shell including a first non-vertically inclined internal surface, a lower end and a first plurality of orifices at the lower end to enable a fluid to transit the first shell; and
coupling at least one additional shell to the base member in a nested arrangement within within the first shell, the at least one additional shell including a second non-vertically inclined internal surface and a second plurality of orifices to enable the fluid to transit the at least one additional shell.

8. The method of claim 7, wherein the first shell and the at least one additional shell comprise conical shells.

9. The method of claim 7, wherein the second plurality of orifices is positioned at different axial position than the first plurality of orifices.

10. The method of claim 7, wherein the coupling the first shell and the at least one additional shell comprises coupling a hub to the base member and coupling the at least one additional shell and the first shell to the hub with the hub nested within the shells.

11. The method of claim 7, wherein the at least one additional shell is shorter than the first shell.

12. A heat sink, comprising:
a base member adapted to establish thermal contact with a circuit device;
a first shell coupled to the base member and including a first non-vertically inclined internal surface, a lower end and first plurality of orifices at the lower end to enable a fluid to transit the first shell; and
at least one additional shell coupled to the base member and nested within the first shell, the at least one additional shell including a second non-vertically inclined internal surface and a second plurality of orifices to enable the fluid to transit the at least one additional shell.

13. The heat sink of claim 12, wherein the first shell and the at least one additional shell comprise conical shells.

14. The heat sink of claim 12, wherein the second plurality of orifices is positioned at different axial position than the first plurality of orifices.

15. The heat sink of claim 12, comprising a hub coupled to the base member and nested within and coupled to the at least one additional shell and the first shell.

16. The heat sink of claim 12, wherein the at least one additional shell is shorter than the first shell.

17. The heat sink of claim 12, comprising an air mover to move the fluid.

18. An apparatus, comprising:
a circuit device; and
a heat sink including a base member in thermal contact with the circuit device;
a first shell coupled to the base member and including a first non-vertically inclined internal surface, a lower end and first plurality of orifices at the lower end to enable a fluid to transit the first shell; and
at least one additional shell coupled to the base member and nested within the first shell, the at least one additional shell including a second non-vertically inclined internal surface and a second plurality of orifices to enable the fluid to transit the at least one additional shell.

19. The apparatus of claim 18, wherein the first shell and the at least one additional shell comprise conical shells.

20. The apparatus of claim 18, wherein the second plurality of orifices is positioned at different axial position than the first plurality of orifices.

21. The apparatus of claim 18, comprising a hub coupled to the base member and nested within and coupled to the at least one additional shell and the first shell.

22. The apparatus of claim 18, wherein the at least one additional shell is shorter than the first shell.

23. The apparatus of claim 18, wherein the circuit device comprises a semiconductor chip.

24. The apparatus of claim 18, comprising an air mover to move the fluid.

25. A method of providing thermal management for a circuit device, comprising:
placing a heat sink in thermal contact with the circuit device, the heat sink including a base member in thermal contact with the circuit device, a first conical shell coupled to the base member and including a first inclined internal surface, a lower end and first plurality of orifices at the lower end to enable a fluid to transit the first shell, and at least one additional shell coupled to the base member and nested within the first shell, the at least one additional conical shell including a second inclined internal surface and a second plurality of orifices to enable the fluid to transit the at least one additional shell; and
moving the fluid through the first shell and the at least one additional shell.

26. A method of manufacturing, comprising:
coupling a first conical shell to a base member adapted to establish thermal contact with a circuit device, the first shell including a first inclined internal surface, a lower end and first plurality of orifices at the lower end to enable a fluid to transit the first conical shell; and
coupling at least one additional conical shell to the base member in a nested arrangement within the first conical shell, the at least one additional conical shell including a second inclined internal surface and a second plurality of orifices to enable the fluid to transit the at least one additional conical shell.

27. A heat sink, comprising:
a base member adapted to establish thermal contact with a circuit device;
a first conical shell coupled to the base member and including a first inclined internal surface, a lower end and first plurality of orifices at the lower end to enable a fluid to transit the first conical shell; and
at least one additional conical shell coupled to the base member and nested within the first conical shell, the at least one additional conical shell including a second inclined internal surface and a second plurality of orifices to enable the fluid to transit the at least one additional conical shell.

* * * * *

UNITED STATES PATENT AND TRADEMARK OFFICE
CERTIFICATE OF CORRECTION

| | | |
|---|---|---|
| PATENT NO. | : 7,911,791 B2 | Page 1 of 1 |
| APPLICATION NO. | : 12/490805 | |
| DATED | : March 22, 2011 | |
| INVENTOR(S) | : Gamal Refai-Ahmed et al. | |

It is certified that error appears in the above-identified patent and that said Letters Patent is hereby corrected as shown below:

On the title page under OTHER PUBLICATIONS, delete "pp. 1-3" and substitute --pp. 1-38-- therefore.

In The Specification

In column 7, line 8, insert --a-- between "at" and "different".

In column 7, lines 42-43, insert --a-- between "a lower end" and "first plurality".

In column 7, line 53, insert --a-- between "at" and "different".

In column 8, lines 2-3, insert --a-- between "a lower end" and "first plurality".

In column 8, line 13, insert --a-- between "at" and "different".

In column 8, line 30, insert --a-- between "a lower end" and "first plurality".

In column 8, line 44, insert --a-- between "a lower end" and "first plurality".

In column 8, lines 56-57, insert --a-- between "a lower end" and "first plurality".

Signed and Sealed this
Nineteenth Day of April, 2016

Michelle K. Lee
*Director of the United States Patent and Trademark Office*